United States Patent
Barber

(10) Patent No.: US 6,861,183 B2
(45) Date of Patent: Mar. 1, 2005

(54) SCATTER DOTS

(75) Inventor: Duane B. Barber, Camas, WA (US)

(73) Assignee: LSI Logic Corporation, Milpitas, CA (US)

( * ) Notice: Subject to any disclaimer, the term of this patent is extended or adjusted under 35 U.S.C. 154(b) by 282 days.

(21) Appl. No.: 10/293,458

(22) Filed: Nov. 13, 2002

(65) Prior Publication Data

US 2004/0091791 A1 May 13, 2004

(51) Int. Cl.[7] .................................................. G03F 9/00
(52) U.S. Cl. .......................... 430/5; 430/311; 430/312; 430/322
(58) Field of Search ............................. 430/5, 311, 312, 430/322

(56) References Cited

U.S. PATENT DOCUMENTS 4,895,780 A * 1/1990 Nissan-Cohen et al. ....... 430/5
6,733,929 B2 * 5/2004 Pierrat ........................... 430/5

OTHER PUBLICATIONS

Finders et al., *KrF lithography for 130 nm*, SPIE vol. 4000, p. 192–205, Optical Microlithography XIII, Jul. 2000.

* cited by examiner

*Primary Examiner*—Geraldine Letscher

(57) ABSTRACT

A mask used for imaging nearly dense features in a substrate. Scatter dots are disposed on the mask in proximity to the nearly dense features, where the scatter dots adjust photon levels of the nearly dense features to a desired level. The adjustment is controlled by selective adjustment of a duty cycle and degree of stagger of the scatter dots. In this manner, the scatter dots adjust the optical properties of the nearly dense features to be very similar to the optical properties of dense features, which enables more accurate imaging of the nearly dense features on the substrate. However, because the scatter dots are discontinuous, they do not overcorrect in the same manner that a scatter bar formed at a minimum resolution might overcorrect. Further, there is a reduced likelihood that the scatter dots would actually print on the substrate.

20 Claims, 1 Drawing Sheet

SCATTER DOTS

FIELD

This invention relates to the field of integrated circuit fabrication. More particularly, this invention relates to integrated circuit imaging methods and materials.

BACKGROUND

Integrated circuits are basically formed of a plurality of layers, where different features are formed in each of the various layers. The features in each of the various layers are typically formed using a photolithographic process. As a part of the process, a photolithographic mask is prepared with the desired image formed in the mask. The substrate on which the integrated circuit is to be formed is coated with a photosensitive material called photoresist, and the photoresist is exposed with a light that is passed through the mask. Thus, the image present in the mask is projected onto the photoresist coated substrate, thereby exposing portions of the photoresist to the light, and masking other portions of the photoresist from the light.

Depending on the type of photoresist used, either negative or positive, those portions of the photoresist that are exposed to the light either remain after the photoresist is developed, or are washed away during the developing process. After a hard bake to drive out solvents from the remaining photoresist, the patterned layer on the substrate is processed in some manner, such as being etched, and the photoresist is removed. A new layer is then deposited or otherwise formed, and the process repeats itself until wafer form processing of the integrated circuit is substantially completed.

There has been a tremendous effort throughout the history of integrated circuit technology to continually find ways to reduce the size of the devices and structures within the monolithic integrated circuits so fabricated. Many problems inherent with the shrinking geometries of integrated circuits have been identified and overcome over the years of such development.

For example, one problem has to do with the imaging process described above. As device size has become increasingly smaller, so too has the size of the mask image used to create the device become increasingly smaller. The size of the image on the mask has become so small, that the images are difficult to resolve properly because the feature size is very close to (or even smaller than) the wavelength of the light used to image the features. These problems are generally described as proximity effects.

What is needed, therefore, is system by which very small devices can be properly imaged in a photoresist coated substrate and proximity effects can be reduced.

SUMMARY

The above and other needs are met by a mask used for imaging nearly dense features in a substrate. Scatter dots are disposed on the mask in proximity to the nearly dense features, where the scatter dots adjust photon levels of the nearly dense features to a desired level. The adjustment is controlled by selective adjustment of a duty cycle and degree of stagger of the scatter dots.

In this manner, the scatter dots adjust the optical properties of the nearly dense features to be very similar to the optical properties of dense features, which enables more accurate imaging of the nearly dense features on the substrate. However, because the scatter dots are discontinuous, they do not overcorrect in the same manner that a scatter bar formed at a minimum resolution might overcorrect. Further, there is a reduced likelihood that the scatter dots would actually print on the substrate.

In various preferred embodiments, the mask is formed on either a quartz substrate or on a sapphire substrate. Preferably the scatter dots and nearly dense features are formed of chrome. An increase in the duty cycle of the scatter dots preferably decreases the photon levels and a decrease in the duty cycle of the scatter dots preferably increases the photon levels. Preferably, an increase in the stagger of the scatter dots decreases a likelihood of printing the scatter dots.

Also described is a photolithographic mask used for imaging features on a monolithic integrated circuit substrate coated with photoresist. An optical substrate receives a light from a light source and passes the light in a substantially unchanged form to the monolithic integrated circuit substrate. Dense features are disposed on the optical substrate for receiving the light from the light source and substantially absorbing, reflecting, and otherwise prohibiting the light from passing through the dense features to the monolithic integrated circuit substrate. The dense features thereby create accurate reproductions of the dense features in the light passing through the optical substrate around the dense features.

Nearly dense features are also disposed on the optical substrate for receiving the light from the light source and substantially absorbing, reflecting, and otherwise prohibiting the light from passing through the nearly dense features to the monolithic integrated circuit substrate. The nearly dense features thereby create imperfect reproductions of the nearly dense features in the light passing through the optical substrate around the nearly dense features. Scatter dots are disposed on the optical substrate in proximity to the nearly dense features. The scatter dots have a duty cycle and a degree of stagger for converting the imperfect reproductions of the nearly dense features into accurate reproductions of the nearly dense features.

In various preferred embodiments, the optical substrate is either a quartz substrate or a sapphire substrate. Preferably the scatter dots, dense features, and nearly dense features are formed of chrome. An increase in the duty cycle of the scatter dots preferably decreases photon levels in the light passing through the optical substrate around the nearly dense features and a decrease in the duty cycle of the scatter dots preferably increases photon levels in the light passing through the optical substrate around the nearly dense features. Preferably an increase in the stagger of the scatter dots decreases a likelihood of printing the scatter dots.

Also described is a method for imaging nearly dense features in a substrate. Light is passed through a mask having the nearly dense features and onto the substrate. The light around the nearly dense features is attenuated with scatter dots that are disposed on the mask in proximity to the nearly dense features. The degree of attenuation of the light is selectively altered by adjusting a duty cycle and degree of stagger of the scatter dots.

In various preferred embodiments, the scatter dots and nearly dense features are formed of chrome. An increase in the duty cycle of the scatter dots preferably decreases the degree of attenuation of the light and a decrease in the duty cycle of the scatter dots preferably increases the degree of attenuation of the light. Preferably an increase in the stagger of the scatter dots decreases a likelihood of printing the scatter dots. The scatter dots are preferably formed at a minimum resolution.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
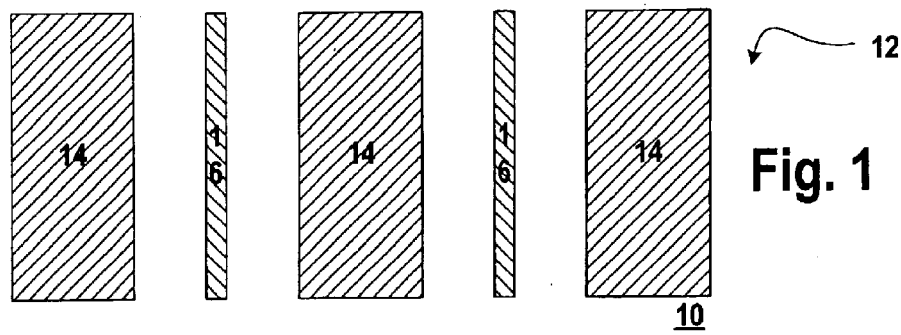
FIG. 1 is a top plan view of a portion of a photolithographic mask depicting nearly dense features and scatter bars formed at a resolution to achieve a desired attenuation.

With reference now to FIG. 1, there is depicted a top plan view of a portion of a photolithographic mask 10 depicting nearly dense features 14 and scatter bars 16. The nearly dense features 14 and the scatter bars 16 are preferably formed of chrome on a quartz or sapphire substrate 12. Thus, the nearly dense features 14 and the scatter bars 16 form optically opaque regions that block light passing through the transparent optical substrate 12 of the mask 10, which optically opaque regions are used to print images corresponding to the nearly dense images 14 on an integrated circuit substrate.

The term "nearly dense" describes an image that is not so close to another image as to have the same effect on the light passing through the mask 10 as images that are closer together, and which are called dense images. Dense images on a mask 10 tend to print in a desired manner, whereas nearly dense images tend to print in a distorted fashion because the space between the images tends to allow too much light to pass, and the images are "overexposed," so to speak. Thus, the scatter bars 16 are placed between the nearly dense images 14 to reduce, or in other words attenuate, the amount of light that is allowed to pass between the nearly dense images 14. In this manner, the amount of passing light is reduced, and the nearly dense images 14 print correctly on the integrated circuit substrate.

The scatter bars 16 are preferably formed at a sub resolution, meaning a resolution that is too small to actually be imaged on the integrated circuit substrate. The scatter bars 16 are preferably drawn on either side of an isolated line on the mask. This makes the feature appear more like a dense line when it is imaged. A scatter bar 16 can also be used adjacent the outermost line among an array of dense lines. On the inner side, the outermost line sees a dense environment, just like all the other lines in the array. However, on the outer side, the outermost line sees an isolated environment, so it will tend to print at a different size than the other lines in the array due to the proximity effect. By drawing a scatter bar 16 on the isolated side of the outermost line, it is possible to make this nearly dense line see a dense environment on both sides, and therefore print more like all the other lines in the array. Again, the goal is to make all features see a similar, dense environment.

Scatter bars 16 work well for making truly isolated features print like dense features. However, the situation is not as simple when considering not dense versus isolated, but dense versus nearly dense. "Nearly dense," as used herein, means a feature that is not so close to another feature as to print like a dense feature, but not so far from another feature as to print like an isolated feature. Thus, the background photon level for a nearly dense feature is not attenuated to the point that it prints like a dense feature, nor is it as high such that it prints like an isolated feature.

In principle, an extremely narrow scatter bar 16 could still increase the background photon level of a nearly dense 14 feature to match that of a truly dense feature. In practice, however, there are limits on just how narrow a scatter bar 16 can be drawn on a mask 10. As a result, any attempt to use a scatter bar 16 for a nearly dense feature 14 is likely to result in an over-correction, again causing the feature to print at a different size than a dense feature. The problem is exacerbated for very small feature sizes, where the proximity effect causes a very large change in printed feature size as the spacing between features changes. This means that not only does failing to correct for the proximity effect cause large errors, but overcorrecting with scatter bars 16 will also produce large errors.

Figure 2:
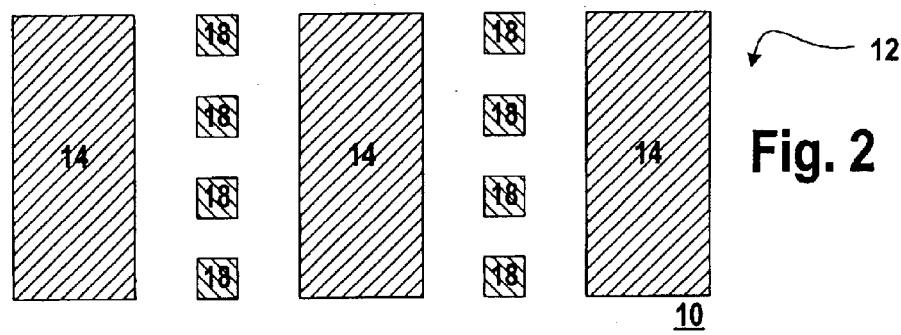
FIG. 2 is a top plan view of a portion of a photolithographic mask depicting nearly dense features and scatter dots formed at a minimum resolution and with a fifty percent duty cycle to achieve the same attenuation as the scatter bars of FIG. 1.

However, by drawing sub resolution scatter dots 18m, as depicted in FIG. 2, instead of sub resolution scatter bars 16, as depicted in FIG. 1, it is possible to reduce the background photon levels to a smaller degree than that offered by even the smallest available scatter bar 16. The amount of correction can be controlled by adjusting the separation between scatter dots 18, or in other words the duty cycle of the scatter dots 18. Consider the case of nearly dense lines 14 that require scatter bars 16 half the width of the narrowest possible scatter bar 16 in order to replicate the background photon levels of dense lines, such as depicted in FIG. 1. In other words, the width of the scatter bars 16 in FIG. 1 are the width that is desired to produce the desire photon levels, but this width is unattainably narrow, and can't actually be produced.

However, the desired background photon level can be obtained by drawing scatter dots 18 between the lines 14, with the scatter dots drawn at the minimum width and at a fifty percent duty cycle, as depicted in FIG. 2. If more background photons are needed, the spacing between scatter dots 18 can simply be increased accordingly. If fewer photons are needed, the spacing between the scatter dots 18 can be decreased, or the scatter dots 18 can be drawn wider or longer. However, most preferably the scatter dots 18 are formed at the minimum resolution in both width and height, with the level of background photons adjusted as necessary by adjusting the duty cycle.

Figure 3:
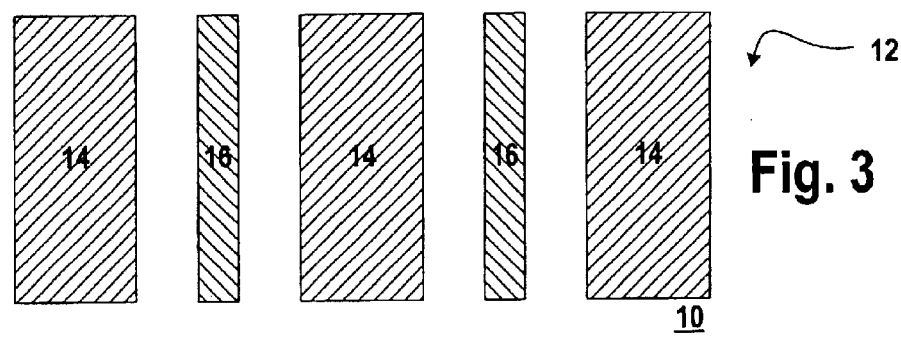
FIG. 3 is a top plan view of a portion of a photolithographic mask depicting nearly dense features and scatter bars formed at a resolution to achieve a desired attenuation.
Figure 4:
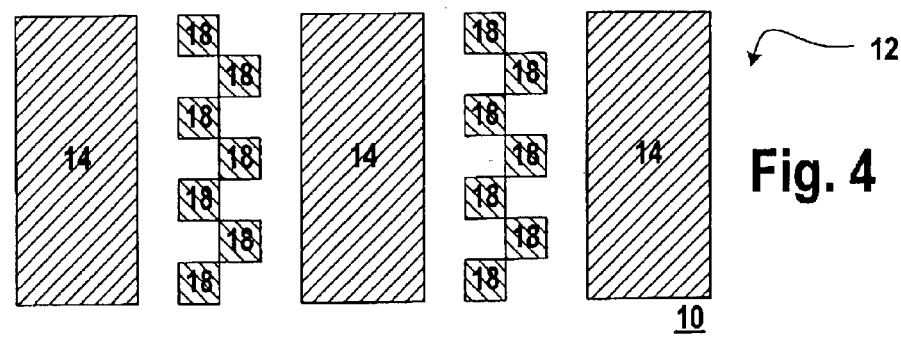
FIG. 4 is a top plan view of a portion of a photolithographic mask depicting nearly dense features and scatter dots formed at a resolution and with an offset to achieve the same attenuation as the scatter bars of FIG. 3.

Scatter dots 18 can also help with another issue. Under some conditions, scatter bars 16, such as depicted in FIG. 3, can actually be imaged on integrated circuit substrates, even though the scatter bars 16 are drawn at what should be sub resolution widths. By using scatter dots 18 at any needed duty cycle, and by drawing the scatter dots 18 in a staggered configuration as depicted in FIG. 4, the scatter features will be much less likely to print on the integrated circuit substrate. In the case of complete staggering, features which are sub resolution in two dimensions, such as scatter dots 18, are much harder to print than features which are sub resolution in only one dimension, such as scatter bars 16. In the intermediate case of partial staggering, the scatter dots 18 are still less likely to print, since there is less of a continuous line to image.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. In a mask used for imaging nearly dense features in a substrate, the improvement comprising scatter dots disposed on the mask in proximity to the nearly dense features, where the scatter dots adjust photon levels of the nearly dense features to a desired level, where the adjustment is controlled by selective adjustment of a duty cycle and degree of stagger of the scatter dots.

2. The mask of claim 1 wherein the mask is formed on a quartz substrate.

3. The mask of claim 1 wherein the mask is formed on a sapphire substrate.

4. The mask of claim 1 wherein the scatter dots and nearly dense features are formed of chrome.

5. The mask of claim 1 wherein an increase in the duty cycle of the scatter dots decreases the photon levels.

6. The mask of claim 1 wherein a decrease in the duty cycle of the scatter dots increases the photon levels.

7. The mask of claim 1 wherein an increase in the stagger of the scatter dots decreases a likelihood of printing the scatter dots.

8. A photolithographic mask used for imaging features on a monolithic integrated circuit substrate coated with photoresist, the photolithographic mask comprising:

an optical substrate for receiving a light from a light source and passing the light in a substantially unchanged form to the monolithic integrated circuit substrate, dense features disposed on the optical substrate, the dense features for receiving the light from the light source and substantially absorbing, reflecting, and otherwise prohibiting the light from passing through the dense features to the monolithic integrated circuit substrate, the dense features thereby creating accurate reproductions of the dense features in the light passing through the optical substrate around the dense features, nearly dense features disposed on the optical substrate, the nearly dense features for receiving the light from the light source and substantially absorbing, reflecting, and otherwise prohibiting the light from passing through the nearly dense features to the monolithic integrated circuit substrate, the nearly dense features thereby creating imperfect reproductions of the nearly dense features in the light passing through the optical substrate around the nearly dense features, and scatter dots disposed on the optical substrate in proximity to the nearly dense features, the scatter dots having a duty cycle and degree of stagger for converting the imperfect reproductions of the nearly dense features into accurate reproductions of the nearly dense features.

9. The mask of claim 8 wherein the optical substrate is a quartz substrate.

10. The mask of claim 8 wherein the optical substrate is a sapphire substrate.

11. The mask of claim 8 wherein the scatter dots, dense features, and nearly dense features are formed of chrome.

12. The mask of claim 8 wherein an increase in the duty cycle of the scatter dots decreases photon levels in the light passing through the optical substrate around the nearly dense features.

13. The mask of claim 8 wherein a decrease in the duty cycle of the scatter dots increases photon levels in the light passing through the optical substrate around the nearly dense features.

14. The mask of claim 8 wherein an increase in the stagger of the scatter dots decreases a likelihood of printing the scatter dots.

15. A method for imaging nearly dense features in a substrate, the method comprising the steps of:

passing light through a mask having the nearly dense features and onto the substrate, attenuating the light around the nearly dense features with scatter dots disposed on the mask in proximity to the nearly dense features, and selectively altering a degree of attenuation of the light by adjusting a duty cycle and degree of stagger of the scatter dots.

16. The method of claim 15 wherein the scatter dots and nearly dense features are formed of chrome.

17. The method of claim 15 wherein an increase in the duty cycle of the scatter dots decreases the degree of attenuation of the light.

18. The method of claim 15 wherein a decrease in the duty cycle of the scatter dots increases the degree of attenuation of the light.

19. The method of claim 15 wherein an increase in the stagger of the scatter dots decreases a likelihood of printing the scatter dots.

20. The method of claim 15 wherein the step of attenuating the light with the scatter dots further comprises formed the scatter dots at a minimum resolution.

* * * * *